US006746196B1

(12) United States Patent
Ozawa et al.

(10) Patent No.: US 6,746,196 B1
(45) Date of Patent: Jun. 8, 2004

(54) VACUUM TREATMENT DEVICE

(75) Inventors: Jun Ozawa, Yamanashi-Ken (JP); Jun Hirose, Yamanashi-Ken (JP); Eiji Hirose, Yamanashi-Ken (JP); Hiroshi Koizumi, Yamanashi-Ken (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/889,148

(22) PCT Filed: Jan. 11, 2000

(86) PCT No.: PCT/JP00/00077
§ 371 (c)(1),
(2), (4) Date: Jul. 12, 2001

(87) PCT Pub. No.: WO00/42650
PCT Pub. Date: Jul. 20, 2000

(30) Foreign Application Priority Data

Jan. 12, 1999 (JP) .......................................... 11-005474

(51) Int. Cl.[7] .............................................. B65G 49/07
(52) U.S. Cl. ....................................... 414/217; 414/939
(58) Field of Search ................. 414/217, 939, 414/941, 935; 294/2

(56) References Cited

U.S. PATENT DOCUMENTS

| | | | | | |
|---|---|---|---|---|---|
| 4,501,527 A | * | 2/1985 | Jacoby et al. | .......... | 414/222.13 |
| 4,951,601 A | * | 8/1990 | Maydan et al. | .......... | 118/715 |
| 5,439,547 A | * | 8/1995 | Kumagai | .......... | 118/715 |
| 5,558,482 A | | 9/1996 | Hiroki et al. | .......... | 414/217 |
| 5,564,889 A | * | 10/1996 | Araki | .......... | 414/222.01 |
| 5,810,935 A | * | 9/1998 | Lee et al. | .......... | 118/500 |
| 5,919,529 A | | 7/1999 | Matsumura | .......... | 427/398.1 |
| 5,989,346 A | * | 11/1999 | Hiroki | .......... | 118/719 |
| 6,045,315 A | * | 4/2000 | Azumano et al. | .......... | 414/217 |
| 6,048,162 A | * | 4/2000 | Moslehi | .......... | 414/217 |
| 6,315,512 B1 | * | 11/2001 | Tabrizi et al. | .......... | 414/217 |
| 2002/0048506 A1 | * | 4/2002 | Babbs et al. | .......... | 414/783 |

FOREIGN PATENT DOCUMENTS

| | | | |
|---|---|---|---|
| GB | 2266992 A | * | 11/1993 |
| JP | 4-69917 | | 3/1992 |
| JP | 5-198660 | | 8/1993 |
| JP | 6-252245 | | 9/1994 |
| JP | 8-222616 | | 8/1996 |
| JP | 9-181142 | | 7/1997 |
| JP | 10-98087 | | 4/1998 |

* cited by examiner

*Primary Examiner*—James W. Keenan
(74) *Attorney, Agent, or Firm*—Smith, Gambrell & Russell, LLP

(57) ABSTRACT

A vacuum treatment device, comprising a vacuum treatment chamber (1) etching a semiconductor wafer (W) as a body to be treated and a preliminary vacuum chamber (2) communicating with the vacuum treatment chamber (1), wherein a transfer arm (5) and first and second buffers (6, 7) for temporarily supporting the wafer (W) are installed in the preliminary vacuum chamber (2), the transfer arm (5) is provided with a flexible arm part (5a) and a support part (16) supporting the wafer (W), the arm part (5a) is extended and retracted by the rotations of a drive side swing arm (14) and a driven side swing arm (15) forming the arm (5a) so as to move the support part (16) straight forward and backward while maintaining it in its attitude, and the first and second buffers (6, 7) are disposed on the motion route of the support part (16) of the transfer arm (5).

11 Claims, 15 Drawing Sheets

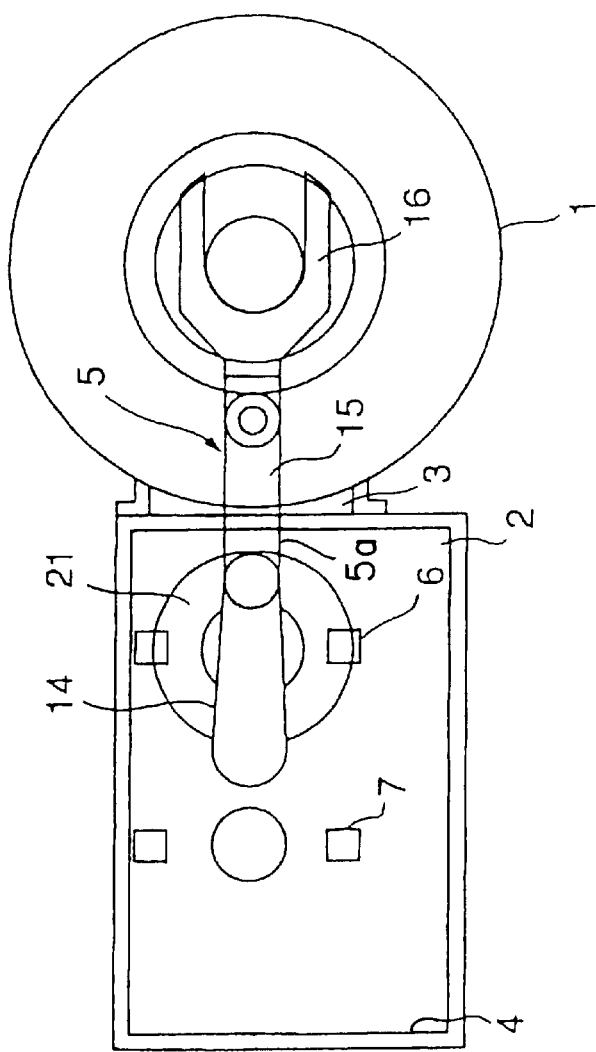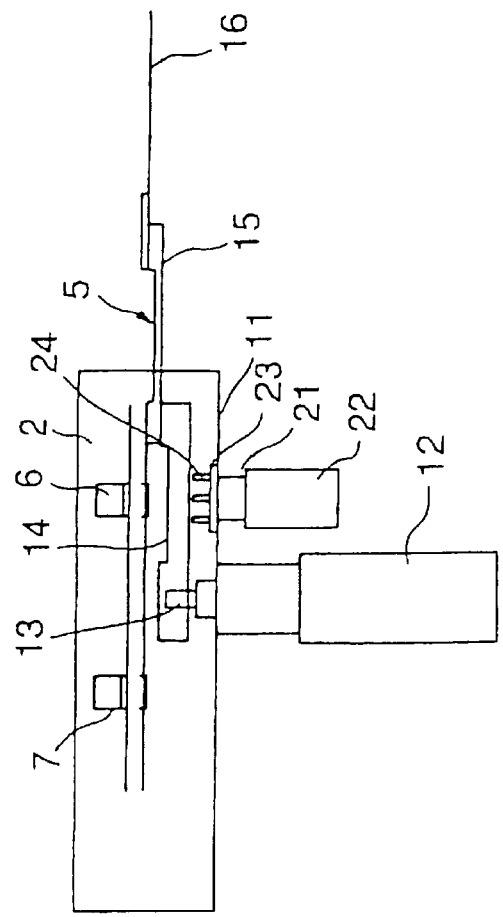
FIG. 1a
FIG. 1b

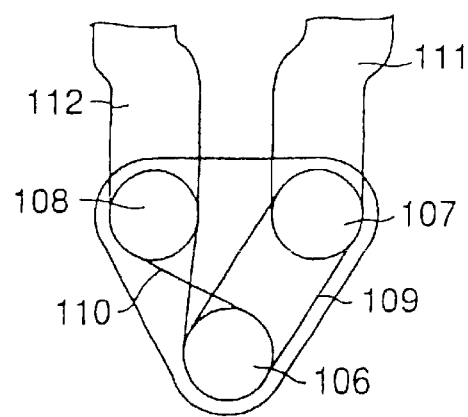
F I G. 11
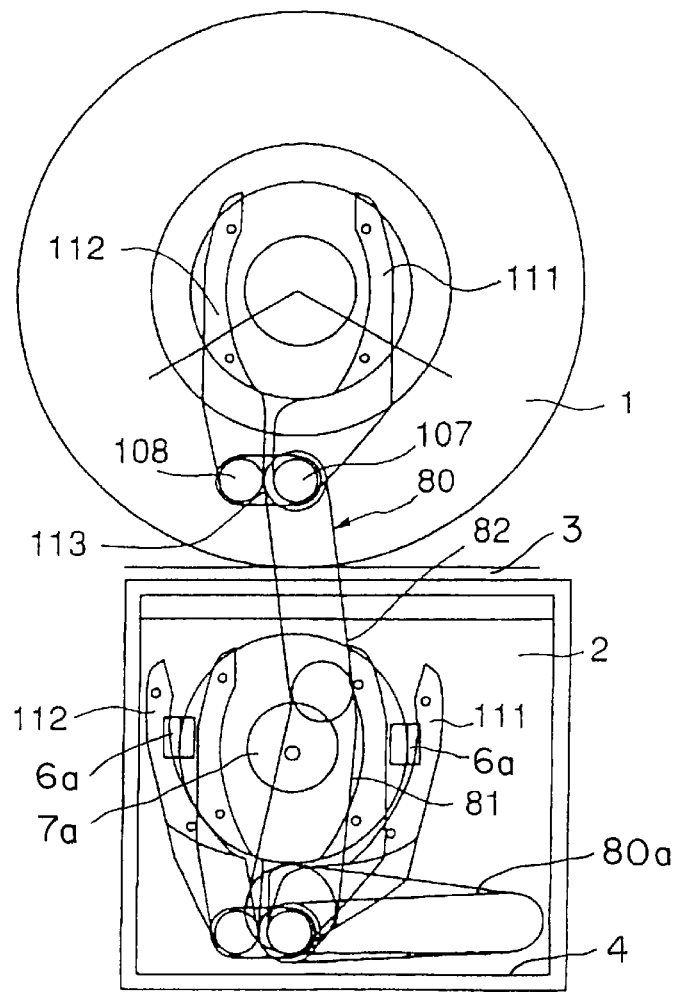
F I G. 12

VACUUM TREATMENT DEVICE

TECHNICAL FIELD

The present invention relates generally to a vacuum processing system for objects to be processed, such as semiconductor wafers and LCD substrates.

BACKGROUND ART

In each process for fabricating semiconductor devices, a load-lock chamber and a transfer chamber are provided for delivering semiconductor wavers serving as objects to be processed, from a clean room to a processing chamber in which a predetermined process is carried out, or for delivering processed semiconductor wafers from the processing chamber to the clean room. The load-lock chamber and the transfer chamber are provided with a transfer system for transferring semiconductor wafers.

That is, conventional vacuum processing systems have a structure wherein a processing chamber, a load-lock chamber and a transfer chamber are interconnected. In view of the prevention of the sacrifice of throughput, it is required to store at least two processed and unprocessed semiconductor wafers in vacuum atmosphere in the load-lock chamber.

As conventional transfer arm mechanisms serving as transfer systems, there are known SCARA (Selective Compliance Assembly Robot Arm) twin pickups types, SCARA dual arm types, flog-leg twin pick types and so forth. All of these mechanisms have a multi-articulated structure which has pivotably connected arms, and have a swivel mechanism on the proximal end side of the arm and a pick on the distal end side for supporting a semiconductor wafer. By the swivel motion of the arm and the bending and stretching motions of the joint portion, the semiconductor wafer is transferred.

However, the above described transfer arms, such as SCARA twin pickups types, SCARA dual arm types and flog-leg twin pick types, have many components and complicated structures and operations, so that the load-lock chamber is enlarged for providing a space, in which the arms are swiveled, to increase costs.

DISCLOSURE OF THE INVENTION

This invention has been made in view of the above described circumstances, and it is an object of the invention to provide a vacuum processing system capable of reducing the size and costs of the system.

In order to accomplish this object, according to the present invention, there is provided a vacuum processing system comprising: a vacuum processing vessel; a load-lock chamber enclosed with a case having a vacuum-side gate valve provided between the chamber and the vacuum processing vessel, and a atmosphere-side gate valve provided on opposite side to the vacuum-side gate valve, the chamber being communicated with an interior of the vacuum processing vessel via the vacuum-side gate valve; a transfer arm, provided in the load-lock chamber, for carrying an object to be processed, in and out of the vacuum processing vessel; and first and second buffers, provided in the load-lock chamber, for temporarily supporting thereon the object, wherein the first buffer is arranged on a side of the vessel, and the second buffer is arranged on a side of the vacuum-side gate valve, and the transfer arm has an arm portion capable of bending and stretching, and a supporting portion for supporting thereon the object, the supporting portion linearly moving along a linearly-moving route passing through the first and second buffers, while maintaining an attitude of the supporting portion, in accordance with bending and stretching of the arm portion.

According to such a vacuum processing system, the object supported on the supporting portion of the transfer arm can be carried in and out if only the arm portion bends and stretches, so that the structure and operation of the transfer arm can be simplified. It is not required to swivel the transfer arm, so that the load-lock chamber can be miniaturized. Therefore, the costs of the vacuum processing system can be lower than those of conventional systems.

The arm portion of the transfer arm may comprise: a swivel driving shaft; a driving-side swivel arm having a proximal end portion, which is fixed to the swivel driving shaft, and a distal end portion; a driven-side swivel arm having a proximal end portion, which is rotatably connected to the distal end portion of the driving-side swivel arm via a swivel driven shaft, and a distal end portion to which the supporting portion is rotatably connected via a joint shaft; and power transmitting members provided between the swivel driving shaft and the swivel driven shaft and between the swivel driven shaft and the joint shaft, respectively.

In the load-lock chamber, the first buffer may be arranged on a side of the vacuum processing vessel and the second buffer may be arranged on an opposite side to the vacuum processing vessel, and a pre-alignment mechanism may be provided below the first buffer.

A pre-alignment mechanism may be provided on any one of the first and second buffers.

According to these vacuum processing systems, the object to be processed can be pre-aligned by the pre-alignment mechanism before the object is carried in the vacuum processing vessel.

The supporting portion of the transfer arm may comprise a pair of picks capable of taking an open position and a closed position, the picks supporting the bottom face of the object in the closed position, and releasing the object in the open position.

According to such a vacuum processing system, by opening and closing the pair of picks of the transfer arm, the object to be processed can be delivered without causing the arm portion to bend and stretch.

The first and second buffers may be provided so that objects to be processed, each of which is supported on a corresponding one of the first and second buffers, overlap with each other viewed from top or bottom.

The supporting portion of the transfer arm may have an upper supporting portion and a lower supporting portion, each of which is capable of supporting thereon the object, the upper supporting portion and the lower supporting portion being offset from each other in the directions of the linear movement of the supporting portion. In that case, the supporting portion of the transfer arm may function as at least one of the first and second buffers.

According to these vacuum processing systems, each of objects to be processed is supported on a corresponding one of the upper supporting portion and the lower supporting portion which are offset from each other. Therefore, it is possible to further simplify the structure than a structure that two supporting portions are independently moved, and it is possible to reduce the operation of the transfer arm.

BRIEF DESCRIPTION OF THE DRAWINGS

FIG. 1a is a schematic horizontal sectional view showing the first preferred embodiment of a vacuum processing system according to the present invention;

FIG. 1b is a schematic longitudinal sectional view showing the preferred embodiment shown in FIG. 1a;

FIG. 2 is a perspective view of a buffer in the preferred embodiment shown in FIG. 1a;

FIG. 3 is an illustration showing operation every stage in the preferred embodiment shown in FIG. 1a;

FIG. 11 is a schematic plan view of a joint portion in the preferred embodiment shown in FIG. 9;

FIG. 12 is a schematic horizontal sectional view showing a modified example of the preferred embodiment shown in FIG. 9;

FIG. 13b is a schematic longitudinal sectional view showing the preferred embodiment shown in FIG. 13a;

FIG. 14a is a plan view of a supporting portion in the preferred embodiment shown in FIG. 13a;

FIG. 14b is a perspective view of the supporting portion shown in FIG. 14a;

FIG. 15 is an illustration showing operation every stage in the preferred embodiment shown in FIG. 13a.

BEST MODE FOR CARRYING OUT THE INVENTION

Figure 2:
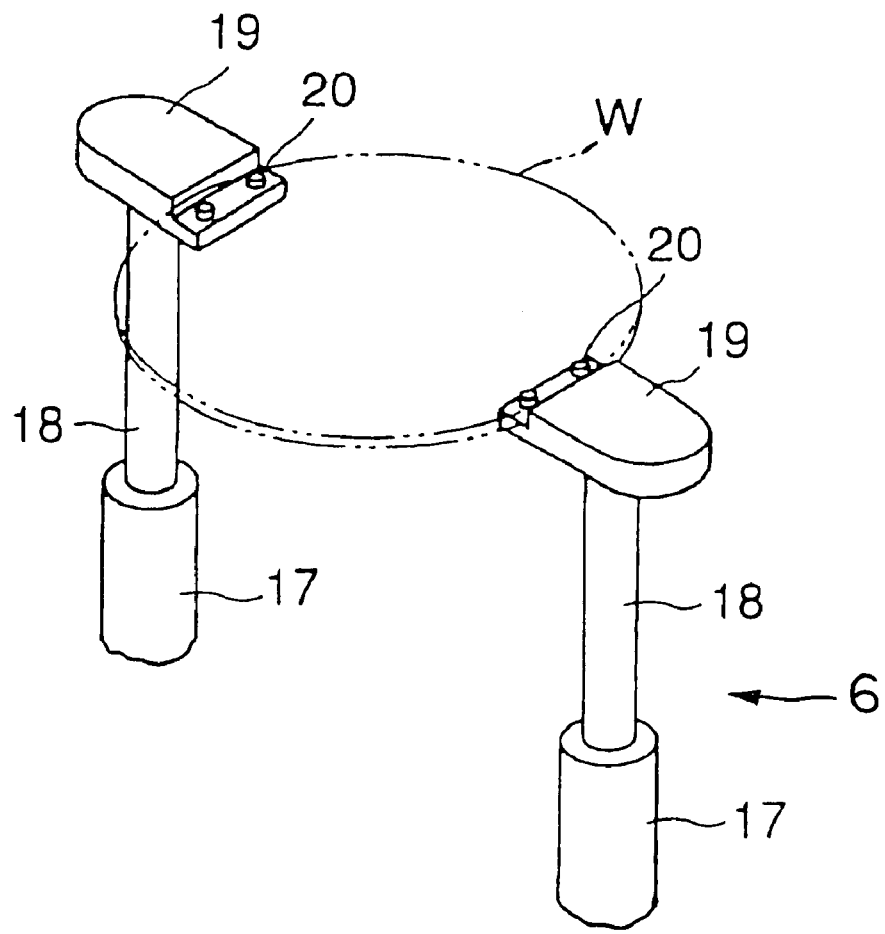

Referring now to the accompanying drawings, the preferred embodiments of a vacuum processing system according to the present invention will be described below.

FIGS. 1a through 3 show the first preferred embodiment of the present invention. The vacuum processing system shown in FIG. 1a comprises a vacuum processing vessel 1 for etching semiconductor wafers serving as objects to be processed (which will be hereinafter referred to as wafers W), and a load-lock chamber 2 enclosed with a case. The load-lock chamber 2 serves both as a transfer chamber and a load-lockchamber. The vacuum processing vessel 1 and the load-lock chamber 2 are communicated with each other via a vacuum-side gate valve 3. On the opposite side of the load-lock chamber 2 from the vacuum-side gate valve 3, an atmosphere-side gate valve 4 is provided.

At the substantially central portion of the load-lock chamber 2, there is provided a SCARA single pick type transfer arm 5 which will be described later. In the load-lock chamber 2, first and second buffers 6 and 7 for temporarily supporting a wafer W are provided so as to face each other across the transfer arm 5. The first buffer 6 is arranged on the side of the vacuum processing vessel 1, and the second buffer 7 is arranged on the side of the atmosphere-side gate valve 4 (on the opposite side from the vacuum processing vessel 1).

The transfer arm 5 has an arm portion 5a capable of bending and stretching, and a forked supporting portion 16 for supporting the wafer W. The arm portion 5a will be described. As shown in FIG. 1b, a swivel driving part 12, such as a normally and reversely rotatable motor, which extends in vertical directions, is fixed to a base 11 which is the bottom of the case enclosing the load-lock chamber 2. The swivel driving part 12 has a swivel driving shaft 13 which projects into the load-lock chamber 2. To the swivel driving shaft 13, the proximal end portion of a driving-side swivel arm 14 is fixed.

As shown in FIGS. 1a and 1b, the proximal end portion of a driven-side swivel arm 15 is connected to the distal end portion of the driving-side swivel arm 14 so as to be pivotable (in a horizontal plane). The supporting portion 16 is connected to the distal end portion of the driven-side swivel arm 15 so as to be pivotable (in a horizontal plane). The pivotal movement of the driving-side swivel arm 14 and the driven-side swivel arm 15 causes the arm portion 5a to bent and stretch, thereby causing the linear (translatory) motion of a supporting portion 16 while maintaining its attitude.

The above described first and second buffers 6 and 7 are arranged on a linearly-moving route of the supporting portion 16 in the transfer arm 5. Since the first buffer 6 and the second buffer 7 have the same structure, only the first buffer 6 shown in FIG. 2 will be described below. As shown in FIG. 2, a pair of vertically moving shafts 18, which are moved by a vertical driving part 17 such as an air cylinder or a motor, are provided in the load-lock chamber 2. To the top end portion of each of the vertically moving shafts 18, a supporting piece 19 is fixed. The supporting piece 19 has a step on its top face. On the bottom stage of the step, a plurality of (preferably 3 or 4) buffer pins 20 of a resin, silicon gum or a ceramic are provided so as to protrude.

The buffers 6 and 7 are designed to support the peripheral portion of the wafer W by means of the buffer pins 20. In place of the buffer pins 20, a detachable O-ring may be used. In that case, by exchanging the O-ring itself before cleaning, it is possible to avoid the difficulty of cleaning around the buffer pins 20.

As shown in FIG. 1b, a pre-alignment mechanism 21 for pre-aligning the wafer W is provided below the first buffer 6. The pre-alignment mechanism 21 has a disk 23 which is vertically moved and rotated by a vertical movement/rotation driving part 22 provided on the base 11 of the case enclosing the load-lock chamber 2, and a plurality of pins 24 which protrude vertically from the disk 23. The pre-alignment mechanism 21 is designed to horizontally support the wafer W on the plurality of pins 24 to pre-align the wafer W.

Figure 3:
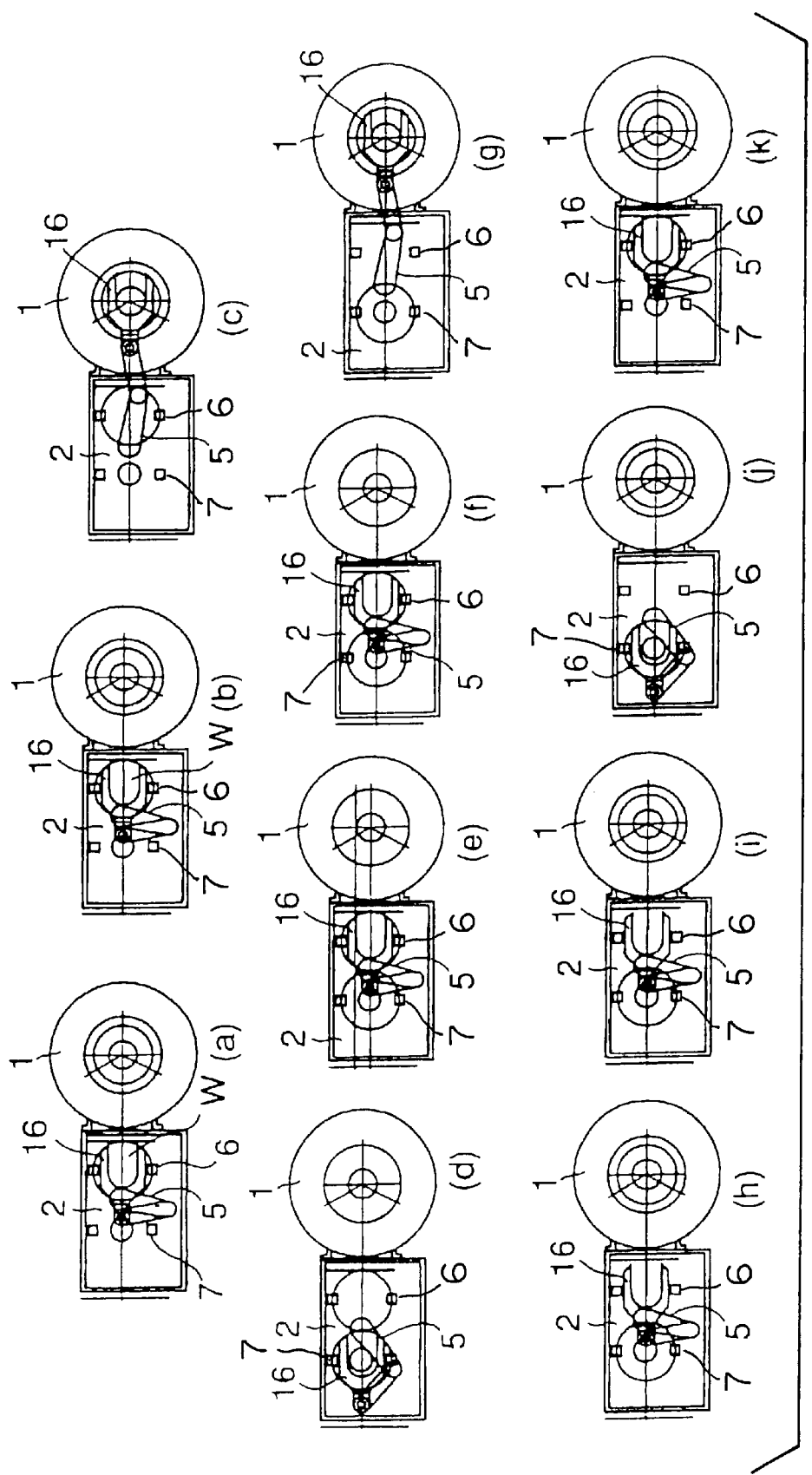

The operation of the first preferred embodiment every one of stages (a) through (k) shown in FIG. 3 will be described below.

FIG. 3(a) shows a state during the etching of the wafer W in the vacuum processing vessel 1. At this stage, the vacuum-side gate valve 3 (FIG. 1a) is closed, and the transfer arm 5 is in its stand-by state in the load-lock chamber 2.

FIG. 3(b) shows a state in which, after the etching of the wafer W is completed, the wafer W is moved upwards by a lifter pin (not shown), and simultaneously, the vacuum-side gate valve 3 is open.

FIG. 3(c) shows a state in which the processed wafer W is carried out of the vacuum processing vessel 1. At this stage, when the supporting portion 16 of the transfer arm 5 first moves forwards to be positioned below the wafer W in the vacuum processing vessel 1, the lifter pin moves downwards, so that the wafer W is mounted on the supporting portion 16. The second buffer 7 waits at its lower position, and the supporting portion 16 of the transfer arm 5 is retracted.

FIG. 3(d) shows a state in which the processed wafer W is carried out of the vacuum processing vessel 1 into the load-lock chamber 2. At this stage, when the wafer W supported on the supporting portion 16 is positioned on the second buffer 7, the second buffer 7 moves upwards to receive the wafer W from the supporting portion 16.

FIG. 3(e) shows a state in which the supporting portion 16 of the transfer arm 5 moves forwards in the load-lock chamber 2.

FIG. 3(f) shows a state in which the supporting portion 16 of the transfer arm 5 is position on the first buffer 6. At this stage, an unprocessed wafer W supported on the first buffer 6 is delivered to the supporting portion 16.

FIG. 3(g) shows a state in which the unprocessed wafer W is carried in the vacuum processing vessel 1. At this stage, when the supporting portion 16 of the transfer arm 5 moves forwards to be positioned on a bottom electrode (not shown) in the vacuum processing vessel 1, the lifter pin moves upwards to receive the wafer W from the supporting portion 16. Thereafter, the supporting portion 16 of the transfer arm 5 is retracted, and the vacuum-side gate valve 3 is closed.

FIG. 3(h) shows a state during etching in the vacuum processing vessel 1. At this stage, when $N_2$ gas is supplied to the load-lock chamber 2 to atmospheric pressures, the atmosphere-side gate valve 4 (FIG. 1a) is open.

FIG. 3(i) shows a state in which, after the atmosphere-side gate valve 4 is open, the processed wafer W is carried out of the load-lock chamber 2, and an unprocessed wafer W is carried in the load-lock chamber 2. At this stage, the carrying-in of the unprocessed wafer W is completed. That is, when the unprocessed wafer W is supported on the second buffer 7, the atmosphere-side gate valve 4 is closed.

FIG. 3(j) shows a state in which the load-lock chamber 2 is evacuated, the supporting portion 16 of the transfer arm 5 is retracted, and the first and second buffers 6 and 7 move downwards.

FIG. 3(k) shows a state in which the supporting portion 16 of the transfer arm 5 moves forwards and the second buffer 7 moves upwards. At this stage, when etching is completed in the vacuum processing vessel 1, the state returns to that in FIG. 3(a), and the above described operations are repeated.

According to this preferred embodiment, by providing the SCARA single pick type transfer arm 5 in the load-lock chamber 2, the wafer W supported on the supporting portion 16 of the transfer arm 5 can be carried in and out if only the arm portion 5a bends and stretches. For that reason, the structure and operation of the transfer arm can be simplified. Since it is not required to swivel the transfer arm, the load-lock chamber 2 can be miniaturized. Therefore, the costs of the vacuum processing system can be lower than those of conventional systems.

Since the pre-alignment mechanism 21 is provided below the first buffer 6 in the load-lock chamber 2, the wafer W can be pre-aligned immediately before it is carried in the vacuum processing vessel 1. For that reason, the wafer W can be precisely carried in the vacuum processing vessel 1.

FIGS. 4 through 8 show the second preferred embodiment of the present invention. In these figures, the same reference numbers are given to the same components as those in the first preferred embodiment to omit the descriptions thereof. In this preferred embodiment, a SCARA single kuwagata (stag beetle like) pick type transfer arm 30 is arranged in a load-lock chamber 2.

Figure 4:
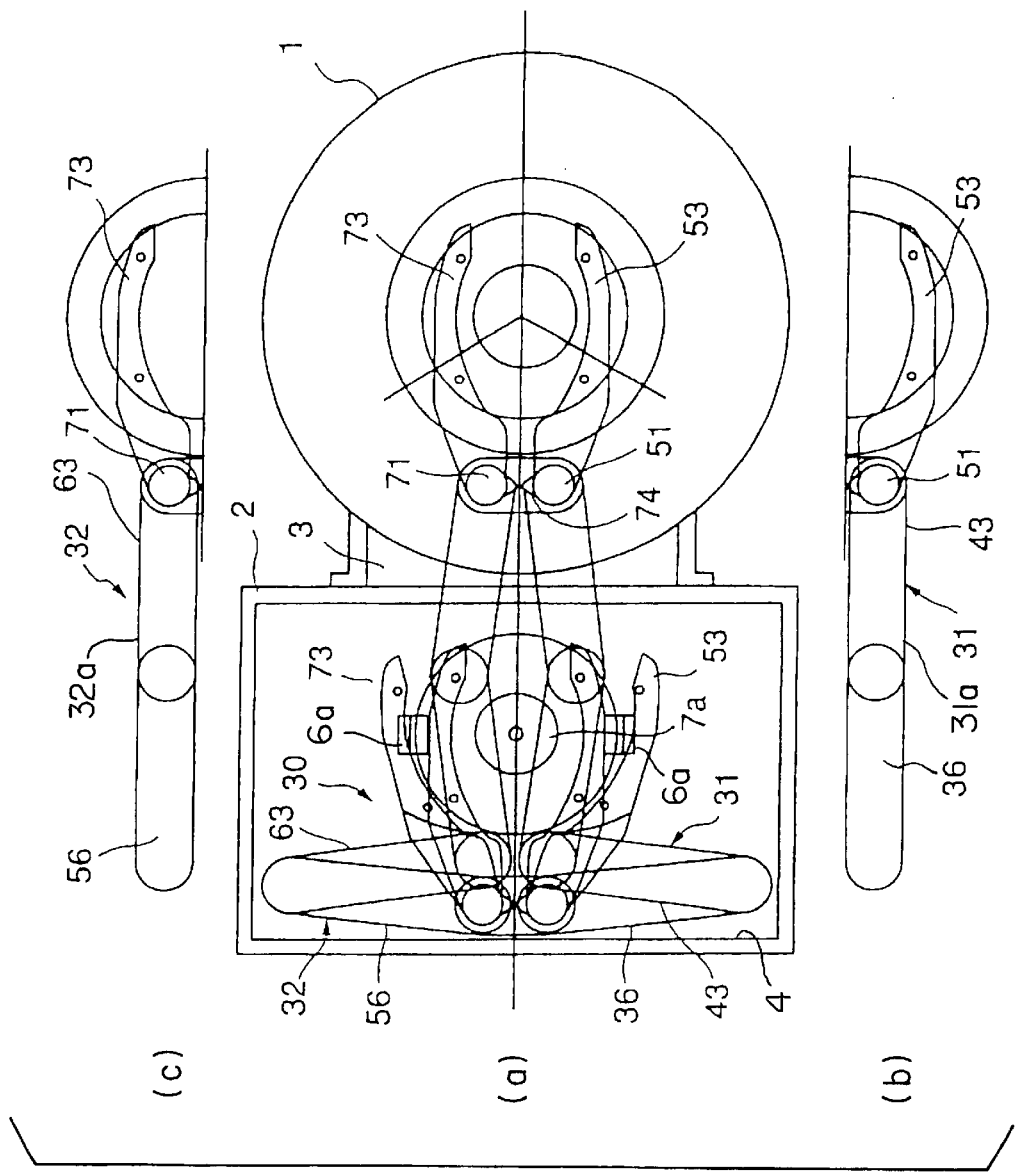
FIG. 4 is a diagram showing the second preferred embodiment of a vacuum processing system according to the present invention, wherein (a) shows a schematic horizontal section, (b) shows a bending and stretching driving arm portion, and (c) shows a pick driving arm portion.

As shown in FIG. 4, the transfer arm 30 comprises a bending and stretching driving arm 31 and a pick driving arm 32 which make a pair. The driving arms 31, 32 have arm portions 31a, 32a capable of bending and stretching, and picks 53 and 73 constituting supporting portions, respectively.

Figure 5:
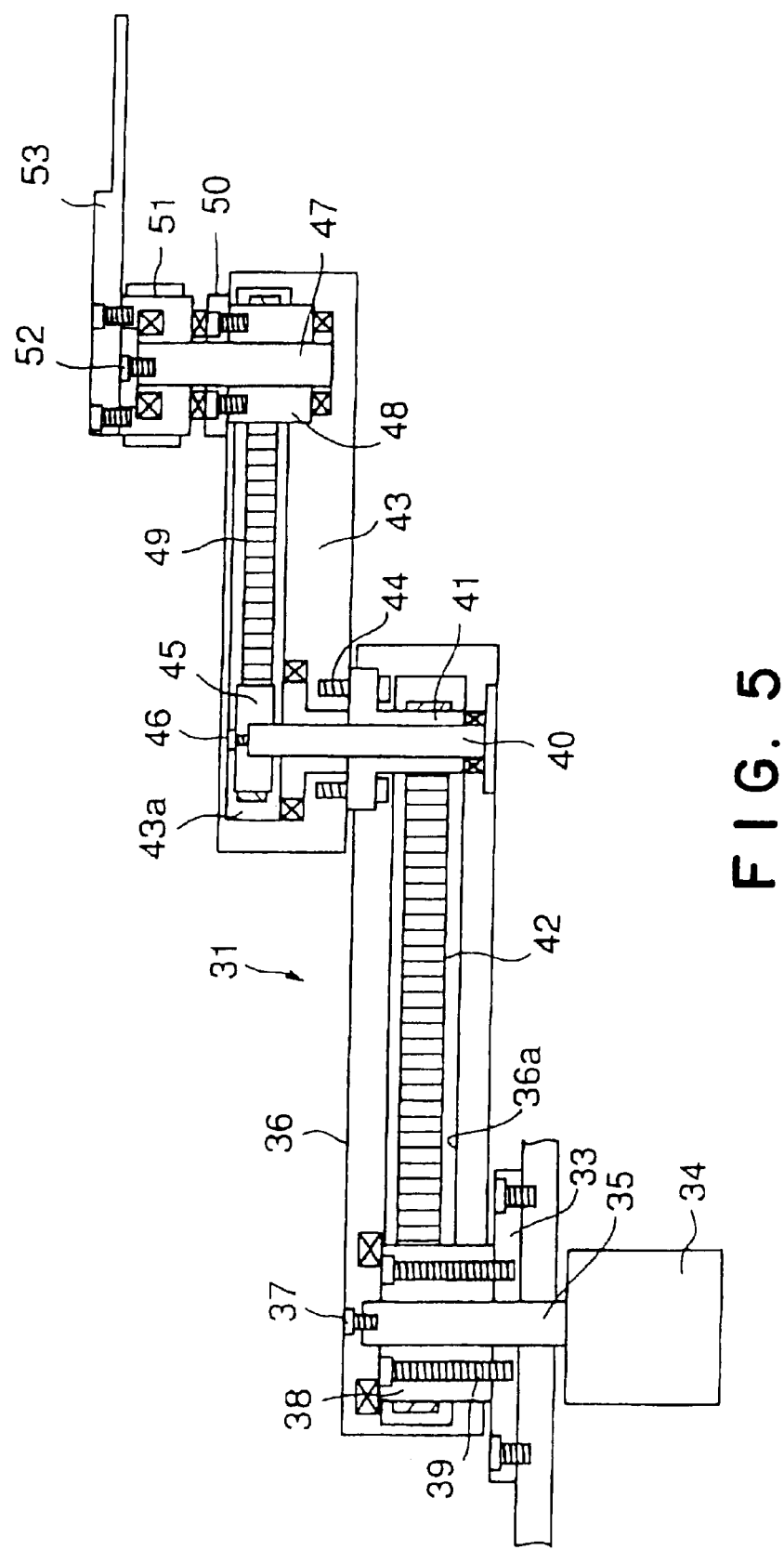
FIG. 5 is a longitudinal sectional view of the bending and stretching driving arm in the preferred embodiment shown in FIG. 4.

First, the bending and stretching driving arm 31 will be described. This arm 31 is constructed as shown in FIG. 5. On a base 33 which is the bottom plate of the case enclosing the load-lock chamber 2, a first motor 34 is mounted so that its rotational shaft (swivel driving shaft) 35 extends in vertical directions. The proximal end portion of a driving-side swivel arm 36 is fixed to the rotational shaft 35. A first pulley 38 which is relatively rotatable about the rotational shaft 35 is fitted into a cavity portion 36a in the driving-side swivel arm 36. The first pulley 38 is fixed to the base 33 by means of bolts 39.

To the distal end portion of the driving-side swivel arm 36, a first pivotably supporting shaft (swivel driven shaft) 40 is fixed. The first pivotably supporting shaft 40 protrudes upwards from the top face of the driving-side swivel arm 36. A second pulley 41 is rotatably fitted onto the first pivotably supporting shaft 40. The rotational ratio of the first pulley 38 to the second pulley 41 is 1:2, and a first belt 42 serving as a power transmitting member is stretched between both pulleys 38 and 41.

The proximal end portion of the driven-side swivel arm 43 is fixed to the top end face of the second pulley 41 by means of bolts 44. In the cavity portion 43a of the driven-side swivel arm 43, a third pulley 45 is fixed to the first pivotally supporting shaft 40 by means of a bolt 46. A second pivotably supporting shaft (joint shaft) 47 is fixed to the distal end portion of the driven-side swivel arm 43. A fourth pulley 48 is rotatably fitted onto the second pivotably supporting shaft 47. The rotational ratio of the third pulley 45 to the fourth pulley 48 is 2:1, and a second belt 49 serving as a power transmitting member is stretched between both pulleys 45 and 48.

The end face of the fourth pulley 48 is provided with a base 50 which protrudes from the top face of the drivenside swivel arm 43. A fifth pulley 51 is rotatably fitted onto the second pivotably supporting shaft 47 by means of a bolt 52. A first pick 53 is fixed to the top face of the fifth pulley 51.

Figure 6:
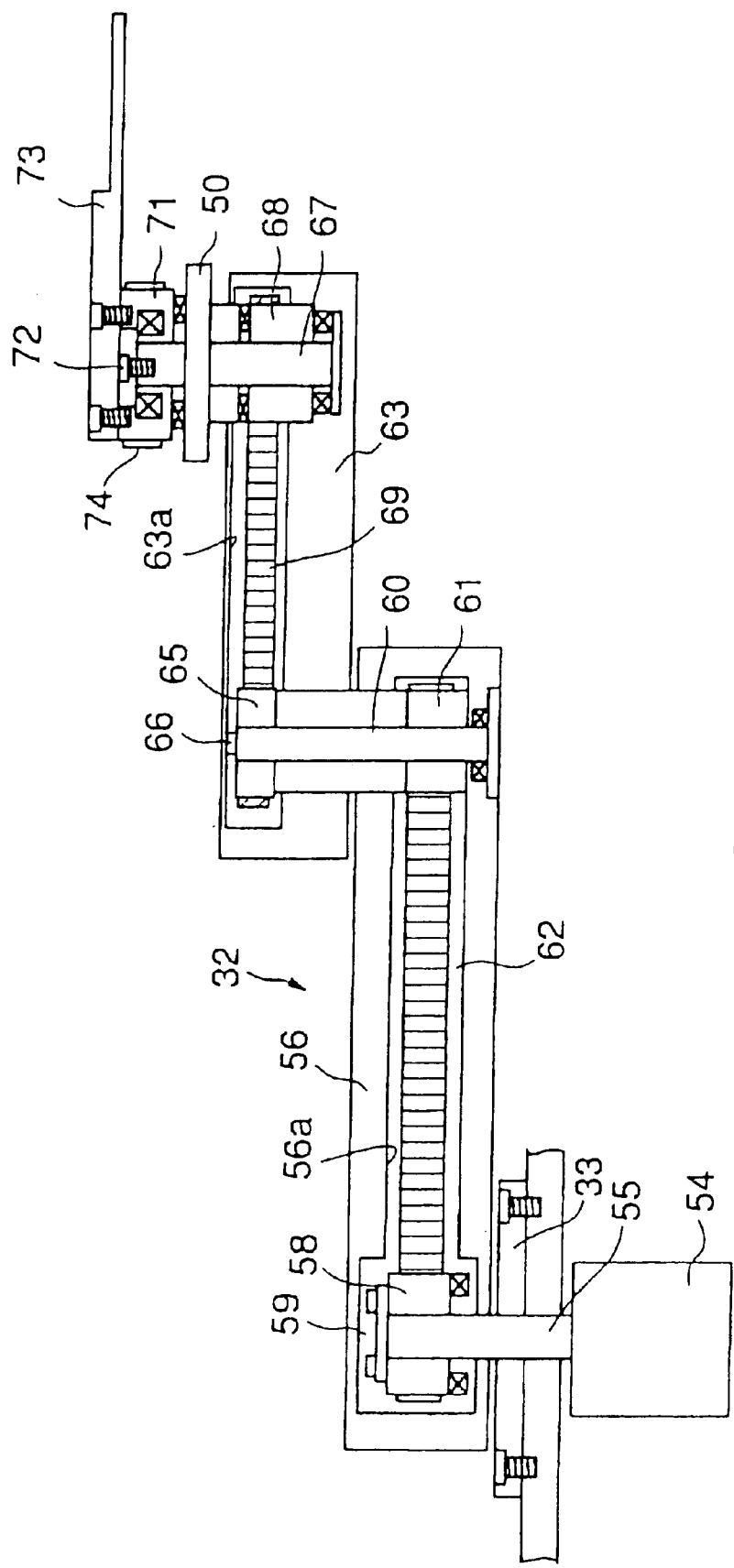
FIG. 6 is a longitudinal sectional view of the pick driving arm in the preferred embodiment shown in FIG. 4.

Then, the pick driving arm 32 will be described. This arm 32 is constructed as shown in FIG. 6. On the base 33 which is the bottom plate of the case enclosing the load-lock chamber 2, a second motor 54 is mounted so that a rotational shaft 55 extends in vertical directions. The proximal end portion of a driving-side swivel arm 56 is pivotably provided on the rotational shaft 55. In a cavity portion 56a in the driving-side swivel arm 56, a first pulley 58 is fixed to the rotational shaft 55 by means of a bolt 59.

A first pivotably supporting shaft (swivel driven shaft) 60 is rotatably provided on the distal end portion of the driving-side swivel arm 56. The first pivotably supporting shaft 60 protrudes upwards from the top face of the driving-side swivel arm 56. A second pulley 61 is fitted onto the first pivotably supporting shaft 60. The rotational ratio of the first pulley 58 to the second pulley 61 is 1:1, and a first belt 62 serving as a power transmitting member is stretched between both pulleys 58 and 61.

The proximal end portion of a driven-side swivel arm 63 is rotatably fitted onto the first pivotably supporting shaft 60. In the cavity portion 63a in the driven-side swivel arm 63, a third pulley 65 is fixed to the second pulley 61. A second pivotably supporting shaft (joint shaft) 67 is fixed to the distal end portion of the driven-side swivel arm 63. A fourth pulley 68 is fitted onto the second pivotably supporting shaft 67. The rotational ratio of the third pulley 65 to the fourth pulley 68 is 1:1, and a second belt 69 serving as a power transmitting member is stretched between both pulleys 65 and 68.

The second pivotably supporting shaft 67 is rotatably provided with a base 50 which protrudes from the top face of the driven-side swivel arm 63. A fifth pulley 72 fixed to the fourth pulley 68 is rotatably fitted onto the top end portion of the second pivotably supporting shaft 67 by means of a bolt 72. A second pick 73 is fixed to the top face of the fifth pulley 71.

Figure 7A:
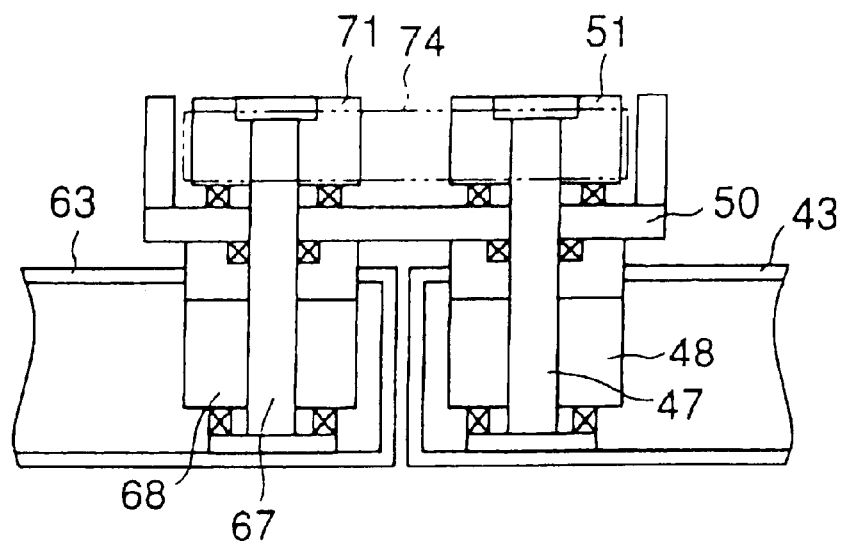
FIG. 7a is a longitudinal sectional view of a joint portion in the preferred embodiment shown in FIG. 4.

As shown in FIG. 7a, a cross belt 74 is stretched between the fifth pulley 51 of the bending and stretching driving arm 31 and the fifth pulley 71 of the pick driving arm 32.

With this construction, the operation of the bending and stretching driving arm 31 and the pick driving arm 32 is as follows.

First, the pulley diameter of the first pulley 38 is set to be 2r, and the pulley diameter of the first pulley 41 is set to be r. In addition, the pulley diameter of the third pulley 45 is set to be r, and the pulley diameter of the fourth pulley 48 is set to be 2r.

It is assumed that the driving-side swivel arm 36 rotates by θ degrees if the rotational shaft 35 of the first motor 34 rotates by θ degrees. Then, the first pulley 38 relatively rotates by −θ degrees with respect to the driving-side swivel arm 36 since it is fixed to the base 33. Since the pulley diameter of the first pulley 38 is 2r, the displacement L1 of the first belt is expressed by L1=−2θr. At this time, the second pulley 41 having a pulley diameter of r rotates by −2θ.

The driven-side swivel arm 43 rotates by −2θ degrees since it is fixed to the second pulley 41. The third pulley 35 relatively rotates by 2θ with respect to the driven-side swivel arm 43 since it is not fixed to the driven-side swivel arm 43. At this time, the displacement L2 of the second belt 49 is L2=2θr since the pulley diameter of third pulley 45 is r. At this time, the rotational angle of the fourth pulley 48 with respect to the driven-side swivel arm 43 is θ due to the pulley diameter 2r, so that the attitude of the base 50 is maintained.

The rotation of the bending and stretching driving arm 31 is transmitted to the pick driving arm 32 by means of a cross belt (not shown) which is stretched near the base 33.

Thus, if the bending and stretching driving arm 31 rotates by θ degrees, the driving-side swivel arm 56 of the pick driving arm 32 rotates by −θ degrees. At this time, the first pulley 58 relatively rotates by θ degrees, and the second pulley 61 rotates by θ degrees via the first belt 62. The driven-side swivel arm 63 rotates by 2θ due to the relationship between the rotation of the driving-side swivel arm 56 and the base 50 which is maintained in the above described attitude.

The third pulley 65 attached directly to the second pulley 61 rotates by θ degrees with respect to the driving-side swivel arm 56, and rotates by −θ degrees with respect to the driven-side swivel arm 63. The fourth pulley 68 also rotates by −θ degrees with respect to the driven-side swivel arm 63. In view of the foregoing, the rotation of the fourth pulley 68 is apparently stopped, so that the first and second picks 53 and 73 are not open and closed by the bending and stretching of the driven-side swivel arm 63.

In order to open and close the first and second picks 53 and 73, the first pulley 58 of the driving-side swivel arm 56 is rotated by θ degrees. The second motor 54 is connected directly to the first pulley 58 and is independent of the driving-side swivel arm 56, so that the driving-side swivel arm 56 is stopped regardless of the rotation of the first pulley 58.

If the first pulley 58 rotates by θ degrees, the second pulley 61, the third pulley 65 and the fourth pulley 68 rotate by θ degrees, respectively, and the fifth pulley 71 also rotates by θ degrees. Meanwhile, the driven-side swivel arm 63 is stopped since the fourth pulley 68 is independent of the driven-side swivel arm 63.

Since the fifth pulleys 71 and 51 are connected to each other by means of the cross belt 74, one fifth pulley 51 rotates by −θ degrees if the other fifth pulley 71 rotates by θ degrees. Therefore, the first and second picks 53 and 73 are open and closed while the driven-side swivel arm 63 stands still.

Figure 7B:
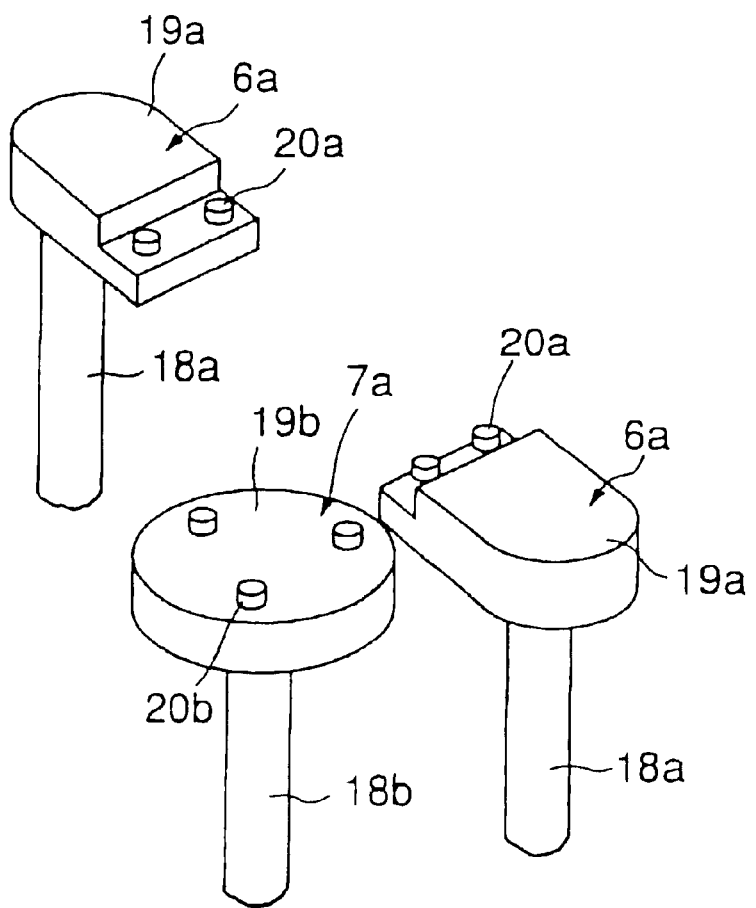
FIG. 7b is a perspective view showing a buffer in the preferred embodiment shown in FIG. 4.

FIG. 7b shows the construction of a buffer in this preferred embodiment. In FIG. 7b, a second buffer 7a is provided between a pair of first buffers 6a and 6a. The first buffers 6a, 6a basically have the same construction as those of the buffers 6, 7 in the first preferred embodiment, and thus, no further discussion is needed. The second buffer 7a has a structure wherein a disk-shaped supporting piece 19b is provided on the top of a vertically moving shaft 18b and a plurality of buffer pins 20b vertically protrude from the top face of the supporting piece 19b.

Figure 8:
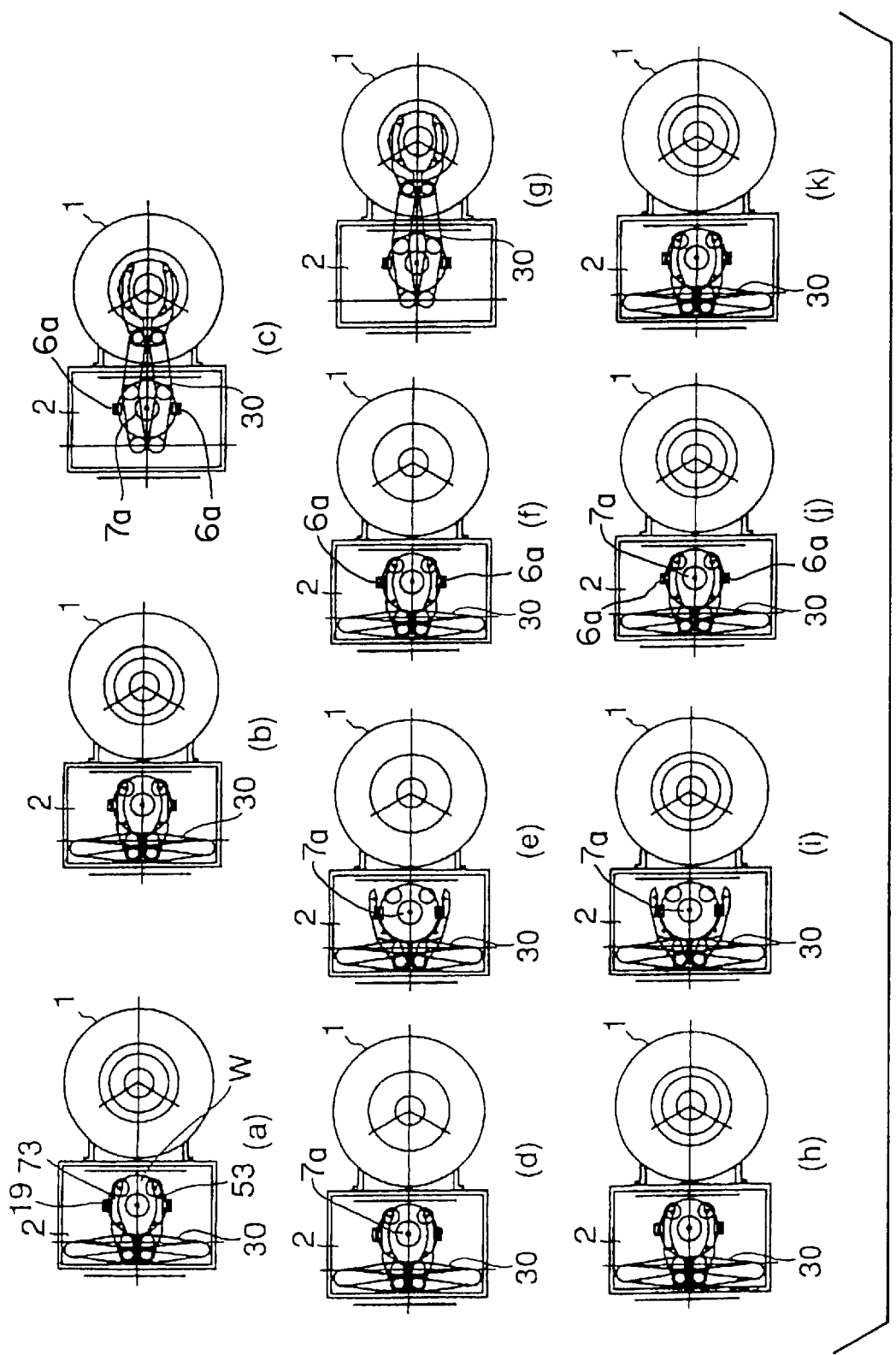
FIG. 8 is an illustration showing operation every stage in the preferred embodiment shown in FIG. 4.

The operation of the second preferred embodiment every one of stages (a) through (k) shown in FIG. 8 will be described below.

FIG. 8(a) shows a state during the etching of the wafer W in the vacuum processing vessel 1. At this stage, the vacuum-side gate valve 3 is closed, and the transfer arm 30 is in its stand-by state in the load-lock chamber 2.

FIG. 8(b) shows a state in which the etching of the wafer W is completed. At this stage, the wafer W is moved upwards by a lifter pin (not shown), and simultaneously, the vacuum-side gate valve 3 (FIG. 4) is open.

FIG. 8(c) shows a state in which the processed wafer W is carried out of the vacuum processing vessel 1. At this stage, the transfer arm 30 is first extended (by the rotation of the driving-side swivel arms 36, 56 and driven-side swivel arms 43, 63 which are shown in FIG. 4) while the first and second picks 53 and 73 are closed. Then, when the first and second picks 53 and 73 are positioned below the wafer W in the vacuum processing vessel, the lifter pin moves downwards, so that the wafer W is mounted on the first and second picks 53 and 73. The first and second buffers 6a, 7a wait at their upper position, and the first and second picks 53 and 73 of the transfer arm 30 are retracted.

FIG. 8(d) shows a state in which the processed wafer W is carried out of the vacuum processing vessel 1 into the load-lock chamber 2. At this stage, when the wafer W supported on the first and second picks 53 and 73 is positioned on the second buffer 7a, the second buffer 7a moves upwards to receive the wafer W from the first and second picks 53 and 73.

FIG. 8(e) shows a state in which the first and second picks 53 and 73 of the transfer arm 30 are open. At this stage, the processed wafer W, together with the second buffer 7a, moves downwards.

FIG. 8(f) shows a state in which the first and second picks 53 and 73 of the transfer arm 30 are closed. At this stage, the first buffer 6a moves downwards, and an unprocessed wafer W is supported on the first and second picks 53 and 73.

FIG. 8(g) shows a state in which the unprocessed wafer W is carried in the vacuum processing vessel 1. At this stage, the first and second picks 53 and 73 of the transfer arm 30 move forwards to be positioned above the bottom electrode in the vacuum processing vessel 1. Then, the lifter pin moves upwards to receive the wafer W from the first and second picks 53 and 73. Then, the first and second picks 53, 73 of the transfer arm 30 are retracted, and the vacuum-side gate valve 3 is closed.

FIG. 8(h) shows a state in which the lifter pin moves downwards to set the wafer W on the bottom electrode (not shown) in the vacuum processing vessel 1, and the vacuum-side gate valve 3 is closed.

FIG. 8(i) shows a state during etching in the vacuum processing vessel 1. At this stage, when $N_2$ gas is supplied to the load-lock chamber 2 to atmospheric pressures, the atmosphere-side gate valve 4 is open. The first and second picks 53 and 73 open, and the second buffer 7a moves upwards to prepare to carry the processed wafer W, which is arranged on the second buffer 7a, out of the load-lock chamber 2.

FIG. 8(j) shows a state in which the first and second picks 53 and 73 are closed to carry the processed wafer W out of the load-lock chamber 2 and in which the second buffer 7a moves downwards to carry an unprocessed wafer W onto the first buffer 6a in the load-lock chamber 2.

FIG. 8(k) shows a state in which the carrying in of the unprocessed wafer W is completed. At this stage, the atmosphere-side gate valve 4 (FIG. 4) is closed, and the load-lock chamber 2 is evacuated. Meanwhile, if etching is completed in the vacuum processing vessel 1, the state returns to that in FIG. 8(a), and the above described operations are repeated.

According to this preferred embodiment, by providing the SCARA single kuwagata (stag beetle like) pickup type transfer arm 30 in the load-lock chamber 2, the structure and operation of the transfer arm can be simplified. The wafer W can be delivered between the transfer arm 30 and the buffers 6a, 7a only by the opening and closing of the first and second picks 53 and 73 and the bending and stretching of the arm portions 31a and 32a without rotating the transfer arm 30, so that the load-lock chamber 2 can be miniaturized. Therefore, the costs of the vacuum processing system can be lower than those of conventional systems.

If the second buffer 7a has a pre-alignment function by adding a swivel function to the second buffer 7a, it is possible to pre-align the wafer W immediately before the wafer W is carried in the vacuum processing system 1.

Figure 9:
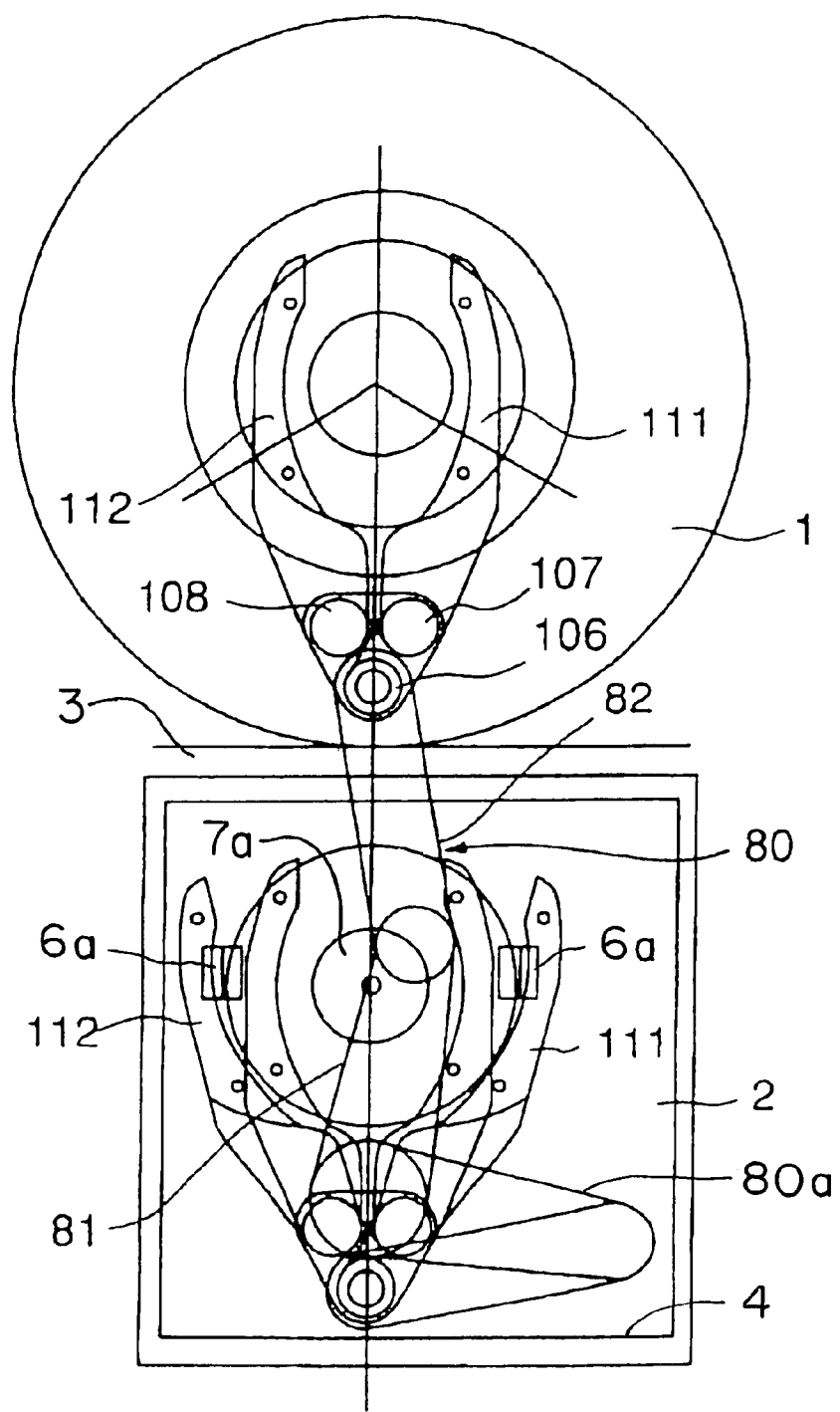
FIG. 9 is a schematic horizontal sectional view showing the third preferred embodiment of a vacuum processing system according to the present invention.
Figure 10:
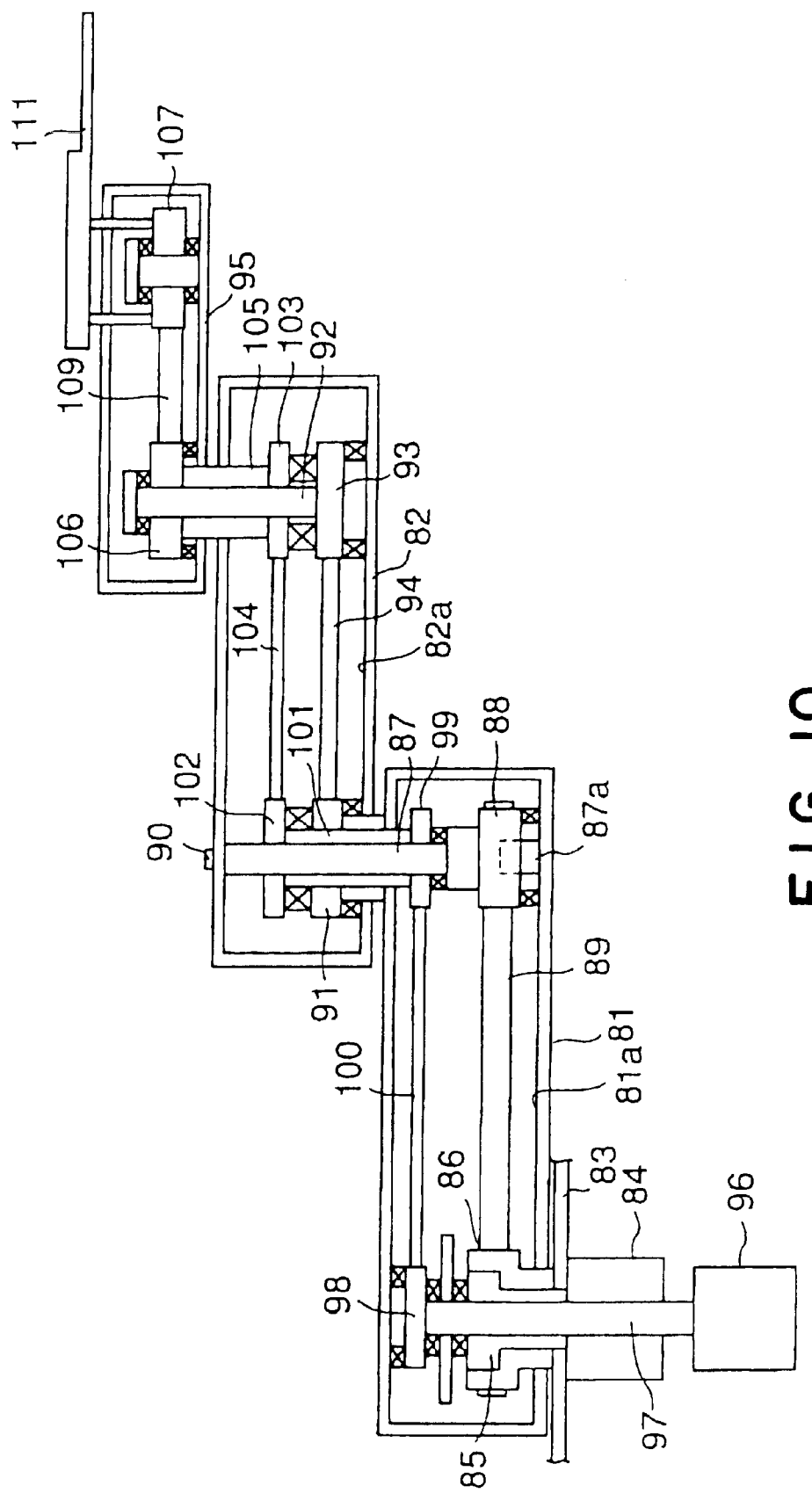
FIG. 10 is a longitudinal sectional view of a transfer arm in the preferred embodiment shown in FIG. 9.

FIGS. 9 through 11 show the third preferred embodiment of the present invention. In these figures, the same reference numbers are given to the same components as those in the first and second preferred embodiments to omit the descrip-tions thereof. In this preferred embodiment, a SCARA single kuwagata (stag beetle like) pick type cantilever transfer arm 80 is arranged in a load-lock chamber 2.

As shown in FIG. 9, the transfer arm 80 comprises an arm portion 80a capable of bending and stretching, and a pair of picks 111 and 112 which constitute a supporting portion. The arm portion 80a has a driving-side swivel arm 81, a driven-side swivel arm 82, and a bending and stretching driving system and pick driving system which are provided in both arms 81 and 82.

First, the bending and stretching driving system will be described. As shown in FIG. 10, on a base 83 which comprises the bottom plate of the case enclosing the load-lock chamber 2, an arm driving motor 84 is mounted so that its rotational shaft (swivel driving shaft) 85 extends in vertical directions. The proximal end portion of the driving-side swivel arm 81 is fixed to the rotational shaft 85. A first pulley 86 which is relatively rotatable about the rotational shaft 85 is fitted into a cavity portion 81a in the driving-side swivel arm 81. The first pulley 86 is fixed to the base 83.

To the distal end portion of the driving-side swivel arm 81, a pivotably supporting shaft 87a is fixed. A second pulley 88 having a first pivotably supporting shaft (swivel driven shaft) 87 is fitted onto the pivotably supporting shaft 87a. The rotational ratio of the first pulley 86 to the second pulley 88 is 1:2, and a first belt 89 serving as a power transmitting member is stretched between both pulleys 86 and 88.

The proximal end portion of the driven-side swivel arm 82 is fixed to the top end face of the first pivotably supporting shaft 87 by means of a bolt 90. In the cavity portion 82a of the driven-side swivel arm 82, a third pulley 91 is rotatably fitted onto the first pivotally supporting shaft 87 and fixed to the driving-side swivel arm 81.

A second pivotably supporting shaft (joint shaft) 92 is rotatably provided on the distal end portion of the driven-side swivel arm 81. A fourth pulley 93 is fixed to the second pivotably supporting shaft 92. The rotational ratio of the third pulley 91 to the fourth pulley 93 is 2:1, and a second belt 94 serving as a power transmitting member is stretched between both pulleys 91 and 93. The second pivotably supporting shaft 92 protrudes from the top face of the driven-side swivel arm 82, and a box-shaped unit 95 is fixed to the top end portion of the second pivotably supporting shaft 92.

Then, the pick driving system will be described. As shown in FIG. 10, the rotational shaft 97 of the pick driving motor 96 passes through the arm driving motor 84 and the rotational shaft 85 to protrude into the cavity portion 81a of the driving-side swivel arm 81. A fifth pulley 98 is fixed to the distal end portion of the rotational shaft 97.

A sixth pulley 99 is rotatably fitted onto the first pivotably supporting shaft 87 of the driving-side swivel arm 81. The rotational ratio of the fifth pulley 98 to the sixth pulley 99 is 1:2, and a third belt 100 serving as a power transmitting member is stretched between both pulleys 98 and 99. The sixth pivotably supporting shaft 99 is connected to a seventh pulley 102, which is provided in the cavity portion 82a of the driven-side swivel arm 82, via a connecting pipe 101 which is fitted onto the first pivotably supporting shaft 87.

An eighth pulley 103 is fitted onto the second pivotably supporting shaft 92 of the driven-side swivel arm 82. The rotational ratio of the seventh pulley 102 to the eighth pulley 103 is 2:1, and a fourth belt 104 serving as a power transmitting member is stretched between both pulleys 102 and 103. The eighth pulley 103 is connected to a ninth pulley 106, which is provided in the unit 95, via a connecting pipe 105 which is fitted onto the second pivotably supporting shaft 92.

As shown in FIG. 11, a tenth pulley 107 and an eleventh pulley 108 are arranged adjacent to the ninth pulley 106 in the unit 95 so as to be associated with that the ninth 106 to form a triangle. A fifth belt 109 is stretched between the ninth pulley 106 and the tenth pulley 107 so that the pulleys 106 and 107 rotate in the same direction. A sixth belt 110 is crossed between the ninth pulley 106 and the eleventh pulley 108 so that the pulleys 106 and 108 rotate in opposite directions.

The tenth pulley 107 is integrally provided with a first pick 111, and the eleventh pulley 108 is integrally provided with a second pick 112. Thus, the pair of picks 111 and 112 are open and closed.

With this construction, the operation of the third preferred embodiment is basically the same as the operation of the second preferred embodiment, and thus, no further discussion is needed.

FIG. 12 shows a modified example of the third preferred embodiment of the present invention. In the modified example shown in FIG. 12, a belt 113 is crossed between the tenth pulley 107, which rotates with the first pick 111, and the eleventh pulley 108 which rotates with the second pick 112. In this case, the pair of picks 111 and 112 are open and closed by directly rotating the tenth pulley 107.

FIGS. 13a through 15 show the fourth preferred embodiment of the present invention. In these figures, the same reference numbers are given to the same components as those in the first preferred embodiment to omit the descriptions thereof.

Figure 13A:
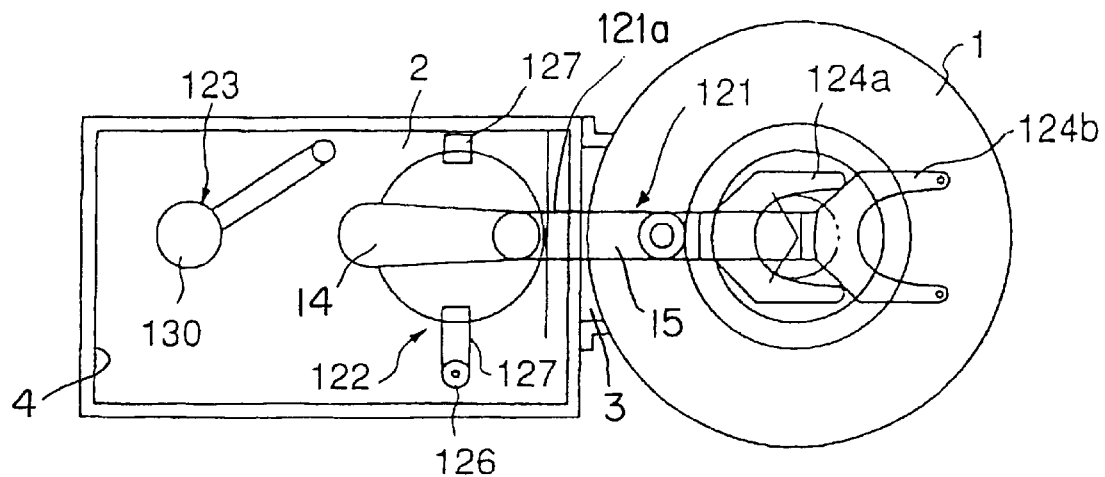
FIG. 13a is a schematic horizontal sectional view showing the fourth preferred embodiment of a vacuum processing system according to the present invention.
Figure 13B:
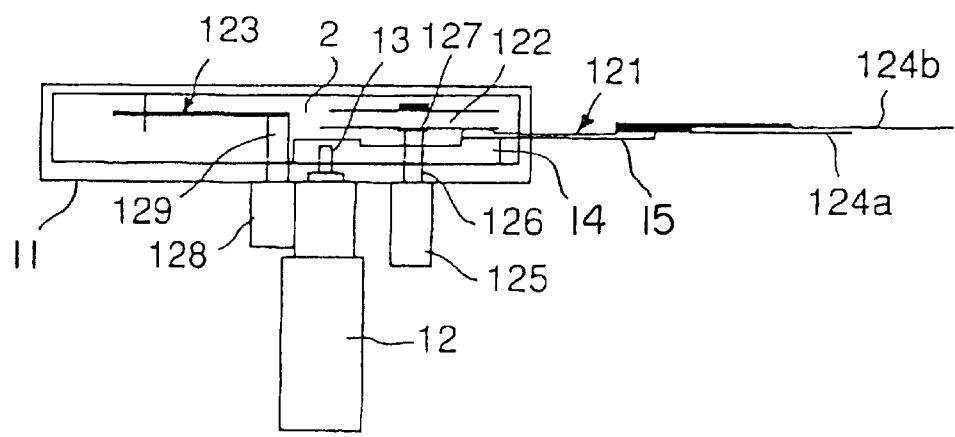

In FIGS. 13a and 13b, a SCARA two-stage pick type transfer arm 121 is provided at a substantially central portion in a load-lock chamber 2. In the load-lock chamber 2, a buffer 122 for temporarily supporting a wafer W is provided on the side of a vacuum processing vessel 1, and a delivery stage 123 is provided on the side of an atmosphere-side gate valve 4 (on the opposite side to the vacuum processing vessel 1).

The transfer arm 121 has an arm portion 121a capable of bending and stretching, and upper and lower supporting portions 124a and 124b for supporting the wafer W thereon. In FIG. 13b, a swivel driving part 12 is fixed to the base 11 of the case enclosing the load-lock chamber 12 so as to extend in vertical directions. The swivel driving shaft 13 of the swivel driving part 12 protrudes into the load-lock chamber 2.

The proximal end portion of a driving-side swivel arm 14 is fixed to the swivel driving shaft 13. The proximal end portion of a driven-side swivel arm 15 is rotatably connected to the distal end portion of the driving-side swivel arm 14. The supporting portions 124a and 124b are connected to the distal end portion of the driven-side swivel arm 15. By rotation of the driving-side swivel arm 14 and the drivenside swivel arm 15, the arm portion 121a bends and stretches. In accordance therewith, the supporting portions 124a and 124b moves linearly while maintaining their attitude.

Figure 14A:
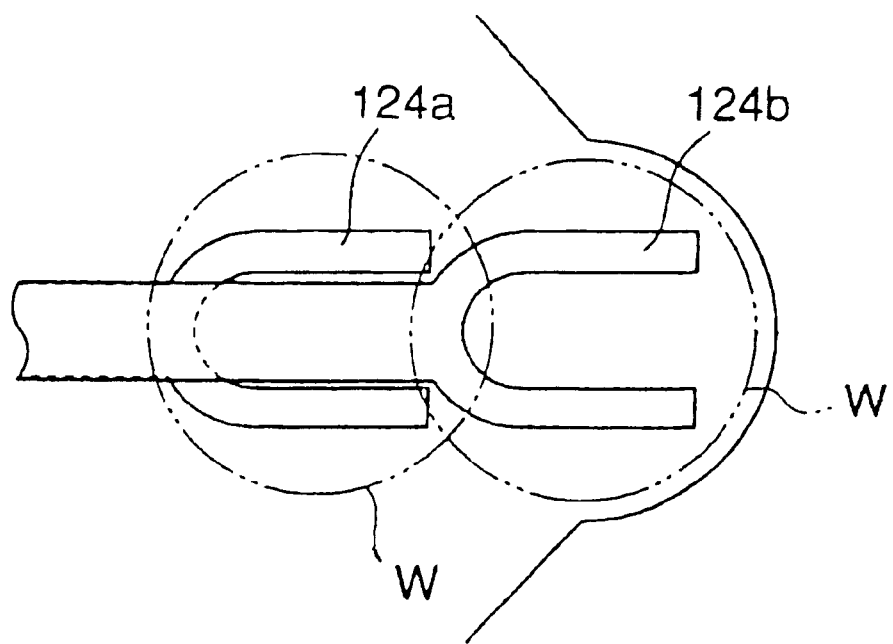
Figure 14B:
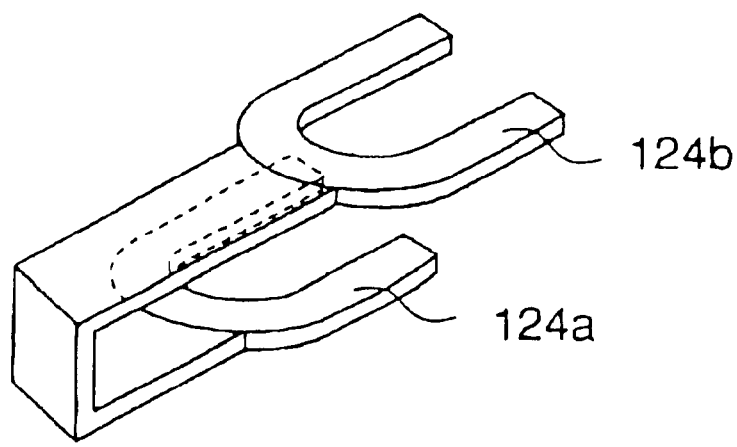

As shown in FIGS. 14a and 14b, the supporting portions 124a and 124b comprise the lower supporting portion 124a and the upper supporting portion 124b. These supporting portions 124a and 124b are offset from each other (in the directions of the linear motion of the supporting portions 124a and 124b) so that the upper supporting portion 124b protrudes forwards from the lower supporting portion 124a. The supporting portions 124a and 124b substantially have the same forked shape. The upper supporting portion 124b is designed to support thereon an unprocessed wafer W, and the lower supporting portion 124b is designed to support thereon a processed wafer W.

As shown in FIG. 13b, the buffer 122 has a supporting piece 127 supported on a pair of vertically moving shafts 126 which are moved by a vertical driving part 125 such as an air cylinder or a motor. The delivery stage 123 has a supporting table 130 supported on a swivel shaft 129 which is rotated by a swivel driving part 128 such as a motor.

Figure 15:
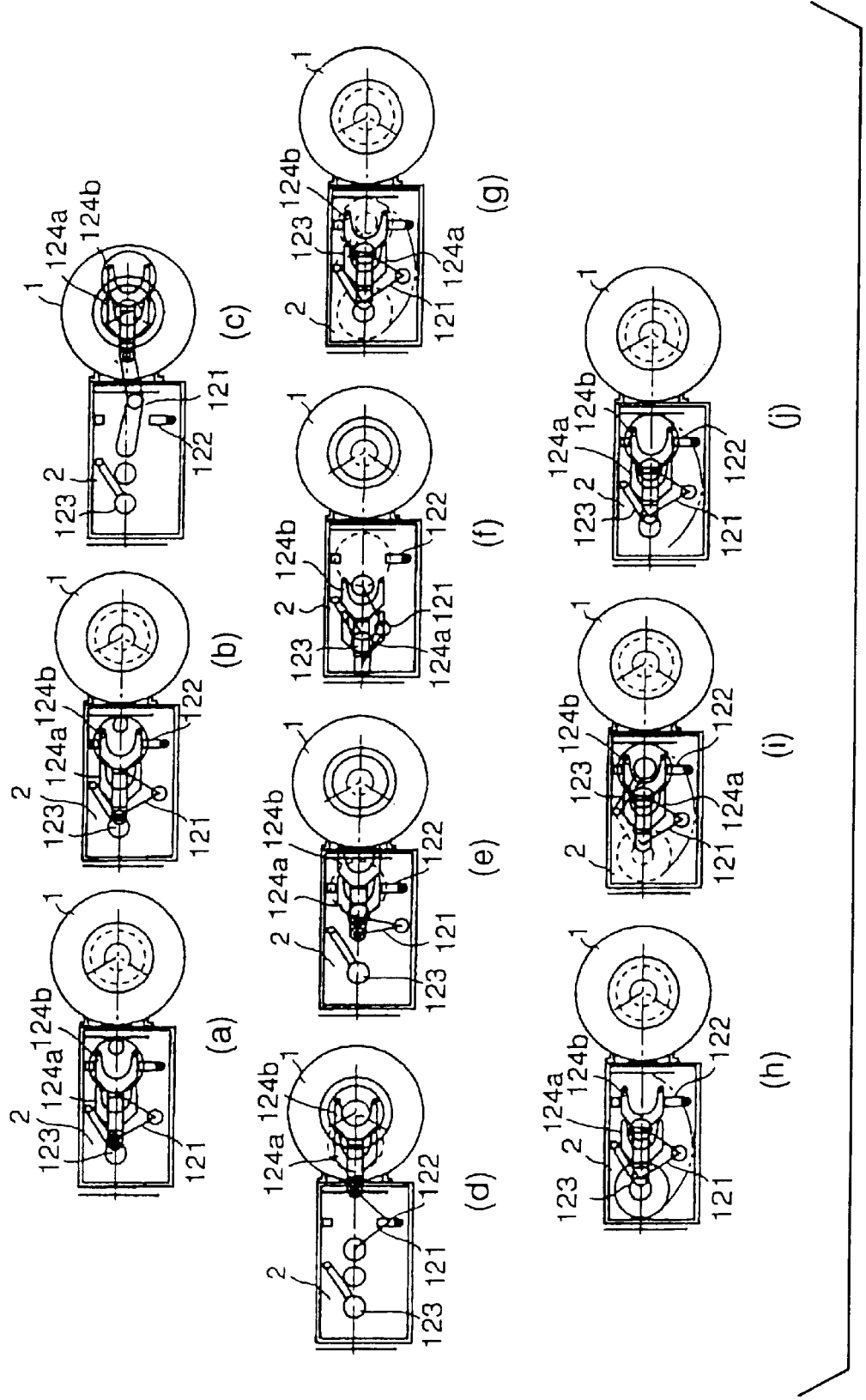

The operation of the fourth preferred embodiment every one of stages (a) through (j) shown in FIG. 15 will be described below.

FIG. 15(a) shows a state during the etching of the wafer W in the vacuum processing vessel 1. At this stage, the vacuum-side gate valve 3 is closed, and the transfer arm 121 is in its stand-by state in the load-lock chamber 2.

FIG. 15(b) shows a state in which the etching of the wafer W is completed. At this stage, the wafer W is moved upwards by a lifter pin (not shown), and simultaneously, the vacuum-side gate valve 3 is open.

FIG. 15(c) shows a state in which the processed wafer W is carried out of the vacuum processing vessel 1. At this stage, the unprocessed wafer W is supported on the upper supporting portion 124b of the transfer arm 121.

First, the supporting portions 124a and 124b of the transfer arm 121 move forwards, and the lower supporting portion 124a is positioned below the wafer W in the vacuum processing vessel 1. Then, the lifter pin moves downwards, so that the wafer W is mounted on the lower supporting part 124a. In this state, the upper supporting portion 124b has a buffer function of temporarily supporting the wafer W thereon.

FIG. 15(d) shows a state in which the unprocessed wafer W is carried in the vacuum processing vessel 1. At this stage, when the transfer arm 121 is retracted and when the upper supporting portion 124b faces a bottom electrode (not shown), the lifter pin moves upwards to receive the unprocessed wafer W which is supported on the upper supporting portion 124b.

FIG. 15(e) shows a state in which the transfer arm 121 is retracted to carry the processed wafer W out of the vacuum processing vessel 1 into the load-lock chamber 2. At this stage, when the processed wafer W supported on the lower supporting portion 124a is positioned above the buffer 122, the buffer 122 moves upwards to receive the wafer W from the upper supporting portion 124 to support the wafer W thereon.

FIG. 15(f) shows a state in which the transfer arm is further retracted, the vacuum-side gate valve 3 is closed, and the vacuum processing vessel 1 starts slowexhaust. Meanwhile, the buffer 122 moves upwards to hold the processed waver W at a higher position than the upper supporting portion 124b.

FIG. 15(g) shows a state in which the receiving stage 123 receives the processed wafer W from the buffer 122. At this stage, after the buffer 122 moves upwards, the supporting table 130 (FIG. 13a) of the receiving stage 123 rotates to a position at which the supporting table 130 faces the buffer 122. Then, the buffer 122 moves downwards, and the processed wafer W is mounted on the supporting table 130 of the receiving stage 123. Then, the receiving stage 123 rotates to the original position.

FIG. 15(h) shows a state in which the processed wafer W is carried out. At this stage, the atmosphere-side gate valve 4 (FIG. 13a) is open, and the processed wafer W supported on the receiving stage 123 is carried out of the load-lock chamber 2. Then, the unprocessed wafer W is mounted on the supporting table 130 of the receiving stage 123.

FIG. 15(i) shows a state in which the unprocessed wafer W is prepared to be carried in the vacuum processing vessel 1. At this stage, after the atmosphere-side gate valve 4 is closed and after a slow exhaust is carried out in the load-lock chamber 2, a standard exhaust starts. At this time, the receiving stage 123 rotates, the buffer 122 moves upwards, and the unprocessed wafer W is supported on the buffer 122. Thereafter, the receiving stage 123 rotates to the original position. Then, when the buffer 122 moves downwards, the unprocessed wafer W is supported on the upper supporting portion 124b of the transfer arm 121.

FIG. 15(j) shows a state in which the etching in the vacuum processing vessel 1 is completed. At this stage, the vacuum-side gate valve 3 is open. Then, the state returns to that in FIG. 15(a), and the above described operations are repeated.

According to this preferred embodiment, by providing the SCARA two-stage pickup type transfer arm 121 in the load-lock chamber 2, i.e., by causing the supporting portions of the transfer arm 121 to have a buffer function, the structure and operation of the transfer arm can be simplified. The wafer W can be carried in and out only by causing the arm portion 121a to bend and stretch without rotating the transfer arm 121, so that the load-lock chamber 2 can be miniaturized. Therefore, the costs of the vacuum processing system can be lower than those of conventional systems. Since the processed wafer W can be replaced with the unprocessed wafer W by one bending and stretching action of the arm portion 121a of the transfer arm 121, it is possible to improve the processing speed.

Figure 16:
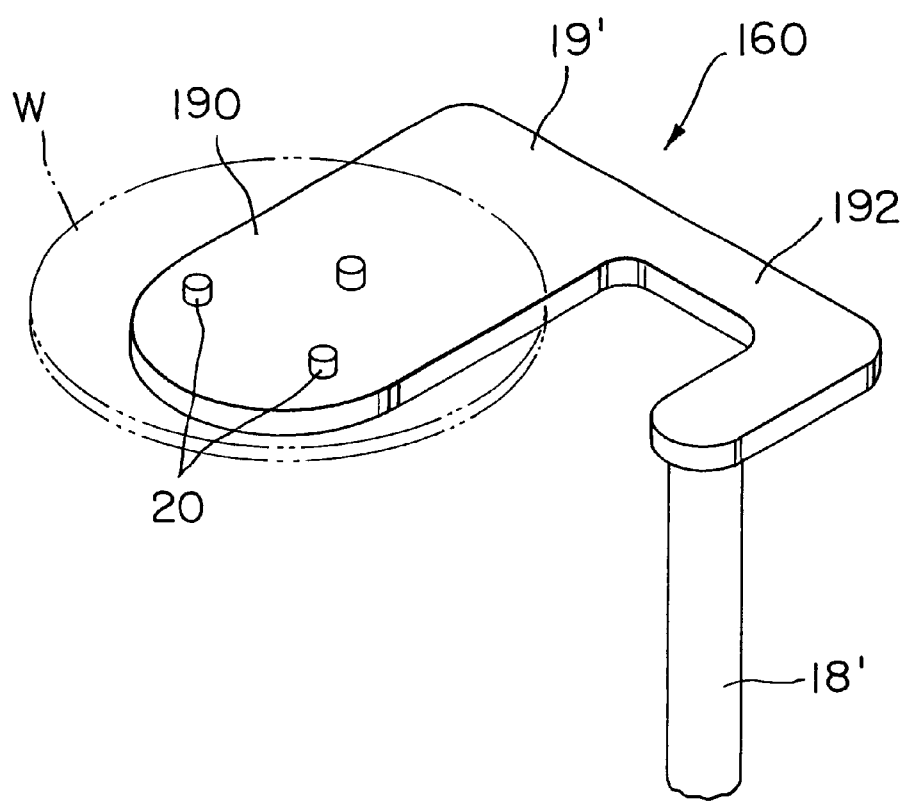
FIG. 16 is a perspective view showing a modified example of a buffer in each of the preferred embodiments.

FIG. 16 shows a modified example of a buffer in each of the preferred embodiments. The buffer 160 shown in FIG. 16 has a supporting piece 19' which is fixed to the top end portion of a vertically moving shaft 18'. The supporting piece 19' has a flat supporting portion 190 on the top face of which a plurality of buffer pins 20 are arranged. The buffer pins 20 (or the above described O-ring) are designed to support thereon the central portion of the wafer W. The supporting piece 19' has a connecting portion 192 for horizontally connecting the supporting portion 190 to the top end portion of the vertically moving shaft 18'. The connecting portion 192 has a substantially L-shape viewed from top or bottom.

While each of the above described preferred embodiments has been applied to etching of a wafer, the present invention should not be limited thereto, but the invention may be applied to a processing system for carrying out a CVD process.

While the first and second buffers have been offset from each other viewed from top or bottom in the first preferred embodiment shown in FIGS. 1a through 3, the first and second buffers may be arranged so that objects to be processed overlap with each other viewed from top or bottom in a state that the objects are supported on both buffers, as the second preferred embodiment shown in FIG. 7b. Thus, the plane dimension of the load-lock chamber can be decreased. However, if both of processed and unprocessed objects are supported on buffers at a high position as the first preferred embodiment, it is possible to decrease the possibility that dust may adhere to the objects to be processed.

What is claimed is:

1. A vacuum processing system comprising:
    a vacuum processing vessel;
    a load-lock chamber enclosed with a case having a vacuum-side gate valve provided between said chamber and said vacuum processing vessel, and an atmosphere-side gate valve provided on a side opposite to said vacuum-side gate valve, said chamber being communicated with an interior of said vacuum processing vessel via said vacuumside gate valve;
    a transfer arm, provided in said load-lock chamber, for carrying an object to be processed, in and out of said vacuum processing vessel; and
    first and second buffers, provided in said load-lock chamber, for temporarily supporting thereon said object,
    wherein said first buffer is arranged on a side of said vessel, and said second buffer is arranged on a side of said atmosphere-side gate valve, said first and second buffers and said vessel being arranged along a single straight line, and
    said transfer arm has an arm portion that can bend or stretch, and a supporting portion for supporting thereon said object, said supporting portion moving continuously along a linearly-moving route corresponding to said straight line, while maintaining an attitude of said supporting portion, in accordance with bending or stretching of said arm portion.

2. A vacuum processing system as set forth in claim 1, wherein said arm portion of said transfer arm comprises:
    a swivel driving shaft;
    a driving-side swivel arm having a proximal end portion, which is fixed to said swivel driving shaft, and a distal end portion;
    a driven-side swivel arm having a proximal end portion, which is rotatably connected to the distal end portion of said driving-side swivel arm via a swivel driven shaft, and a distal end portion to which said supporting portion is rotatably connected via a joint shaft; and
    power transmitting members provided between said swivel driving shaft and said swivel driven shaft and between said swivel driven shaft and said joint shaft, respectively.

3. A vacuum processing system as set forth in claim 1, wherein a pre-alignment mechanism is provided below said first buffer.

4. A vacuum processing system as set forth in claim 3, wherein said pre-alignment mechanism has a vertical movement/rotation mechanism for vertically moving and rotating said object to be processed.

5. A vacuum processing system as set forth in claim 1, wherein a pre-alignment mechanism is provided on any one of said first and second buffers.

6. A vacuum processing system as set forth in claim 5, wherein said pre-alignment mechanism has a vertical movement/rotation mechanism for vertically moving and rotating said object to be processed.

7. A vacuum processing system as set forth in claim 1, wherein said supporting portion of said transfer arm comprises a pair of picks moveable between an open position and a closed position, said picks supporting a bottom face of said object in said closed position, and leaving the bottom face of said object to release said object in said open position.

8. A vacuum processing system as set forth in claim 1, wherein said first and second buffers are provided so that objects, each of which is supported on a corresponding one of said first and second buffers, overlap with each other viewed from top or bottom.

9. A vacuum processing system as set forth in claim 1, wherein said supporting portion of said transfer arm has an upper supporting portion and a lower supporting portion, each of which is capable of supporting thereon said object, said upper supporting portion and said lower supporting portion being offset from each other in the direction of the linear movement of said supporting portion.

10. A vacuum processing system as set forth in claim 9, wherein said supporting portion of said transfer arm functions as at least one of said first and second buffers.

11. A vacuum processing system comprising:

a vacuum processing vessel;

a load-lock chamber enclosed with a case having a vacuum-side gate valve provided between said chamber and said vacuum processing vessel, and an atmosphere-side gate valve provided on a side opposite to said vacuum-side gate valve, said chamber being communicated with an interior of said vacuum processing vessel via said vacuum-side gate valve;

a transfer arm, provided in said load-lock chamber, for carrying an object to be processed, in and out of said vacuum processing vessel; and first and second buffers, provided in said load-lock chamber, for temporarily supporting thereon said object, wherein said first buffer is arranged on a side of said vessel, and said second buffer is arranged on a side of said atmosphere-side gate valve, and said transfer arm has an arm portion that can bend or stretch, and a supporting portion for supporting thereon said object, said supporting portion linearly moving along a linearly-moving route passing through said first and second buffers, while maintaining an attitude of said supporting portion, in accordance with bending or stretching of said arm portion, said supporting portion of said transfer arm has an upper supporting portion and a lower supporting portion, each of which is capable of supporting thereon said object, said upper supporting portion and said lower supporting portion being offset from each other in the direction of the linear movement of said supporting portion, said upper supporting portion and said lower supporting portion are fixedly offset from each other in the direction of the linear movement of said supporting portion.

* * * * *